United States Patent
Cheng et al.

(10) Patent No.: US 11,968,868 B2
(45) Date of Patent: Apr. 23, 2024

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Likun Cheng, Wuhan (CN); Liang Sun, Wuhan (CN); Shijuan Yi, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 548 days.

(21) Appl. No.: 17/281,877

(22) PCT Filed: Dec. 31, 2020

(86) PCT No.: PCT/CN2020/142368
§ 371 (c)(1),
(2) Date: Mar. 31, 2021

(87) PCT Pub. No.: WO2022/141497
PCT Pub. Date: Jul. 7, 2022

(65) Prior Publication Data
US 2022/0406879 A1    Dec. 22, 2022

(30) Foreign Application Priority Data

Dec. 30, 2020  (CN) .......................... 202011605538.7

(51) Int. Cl.
*H01L 29/08*   (2006.01)
*H10K 59/122*   (2023.01)
*H10K 59/131*   (2023.01)

(52) U.S. Cl.
CPC ....... *H10K 59/1315* (2023.02); *H10K 59/122* (2023.02)

(58) Field of Classification Search
CPC ............. H10K 59/1315; H10K 59/122; H10K 59/131; H10K 59/1213; H10K 59/1201;
(Continued)

(56) References Cited

U.S. PATENT DOCUMENTS

2016/0049602 A1   2/2016 Kim
2019/0311674 A1  10/2019 Shin et al.

FOREIGN PATENT DOCUMENTS

CN    204189792 U    3/2015
CN    104635981 A    5/2015
(Continued)

OTHER PUBLICATIONS

Chinese Office Action in corresponding Chinese Patent Application No. 202011605538.7 dated Apr. 1, 2022, pp. 1-8.
(Continued)

*Primary Examiner* — Niki H Nguyen
(74) *Attorney, Agent, or Firm* — PV IP PC; Wei Te Chung; Zhigang Ma

(57) ABSTRACT

A display panel and a display device are disclosed. The display panel includes a plurality of pixel island regions spaced apart from each other. A plurality of connection bridge regions connecting adjacent ones of the pixel island regions to each other. At least one of the connection bridge regions includes a first metal layer, a second metal layer, and a third metal layer disposed in a stacked arrangement, and each of the first metal layer, the second metal layer, and the third metal layer is patterned into at least one metal trace.

18 Claims, 5 Drawing Sheets

(58) Field of Classification Search
CPC ...... H10K 59/12; H10K 71/00; H10K 59/123;
H10K 59/124; H10K 50/844; H10K
59/00; H10K 50/8426; H10K 59/126;
H10K 77/111; H10K 2102/3026; H10K
59/40; H10K 2102/311; H10K 71/80;
H10K 59/38; H10K 59/1216; H10K
50/00; H10K 50/84; H10K 50/828; H10K
50/805; H10K 59/121; H10K 59/1275;
H10K 50/81; H10K 59/127; H10K 50/82;
H10K 59/35; H10K 59/351; H10K 50/11;
H10K 50/865; H10K 59/353; H10K
59/88; H10K 50/80; H10K 50/824; H10K
59/10; H10K 2102/351; H10K 77/10;
H10K 50/8423; H10K 59/65; H10K
59/352; H10K 50/814; H10K 50/171;
H10K 50/818; H10K 50/856; H10K
59/30; H10K 2102/103; H10K 50/15;
H10K 71/166; H10K 2102/3031; H10K
50/16; H10K 2101/27; H10K 50/125;
H10K 50/17; H10K 59/805; H10K
59/179; H10K 71/231; H10K 50/13;
H10K 2102/00; H10K 50/822; H10K
59/129; H10K 85/615

See application file for complete search history.

(56) References Cited

FOREIGN PATENT DOCUMENTS

| CN | 105914227 | A |   | 8/2016  |            |
|----|-----------|---|---|---------|------------|
| CN | 109448570 | A |   | 3/2019  |            |
| CN | 109585514 | A |   | 4/2019  |            |
| CN | 109860246 | A |   | 6/2019  |            |
| CN | 209150099 | U |   | 7/2019  |            |
| CN | 110289292 | A | * | 9/2019  | ........... G06F 1/1652 |
| CN | 110289292 | A |   | 9/2019  |            |
| CN | 111213116 | A |   | 5/2020  |            |
| CN | 210575936 | U |   | 5/2020  |            |
| CN | 111326068 | A |   | 6/2020  |            |
| CN | 111326542 | A |   | 6/2020  |            |
| CN | 111326542 | A | * | 6/2020  | ......... H01L 27/3276 |
| CN | 111627921 | A |   | 9/2020  |            |
| CN | 111833753 | A |   | 10/2020 |            |
| CN | 111863901 | A |   | 10/2020 |            |
| CN | 111987134 | A |   | 11/2020 |            |
| IN | 111370454 | A |   | 7/2020  |            |

OTHER PUBLICATIONS

International Search Report in International application No. PCT/CN2020/142368, dated Sep. 28, 2021.
Written Opinion of the International Searching Authority in International application No. PCT/CN2020/142368, dated Sep. 28, 2021.

* cited by examiner

DISPLAY PANEL AND DISPLAY DEVICE

RELATED APPLICATIONS

This application is a Notional Phase of PCT Patent Application No. PCT/CN2020/142368 having international filing date of Dec. 31, 2020, which claims the benefit of priority of Chinese Patent Application Nos. 202011605538.7 filed on Dec. 30, 2020. The contents of the above applications are all incorporated by reference as if fully set forth herein in their entirety.

BACKGROUND OF INVENTION

1. Field of Invention

The present invention relates to a technical field of displays, and particularly to, a display panel and a display device.

2. Related Art

Compared with foldable and rollable displays, stretchable flexible displays feature light weight and thinness, low power consumption, and adjustable mechanical properties, and the displays can be stretched in any direction and still guarantee a good display effect, which is one of key directions of the next generation of new flexible display research.

In order to facilitate tensile strain, flexible polyimide (PI) substrates are structured with islands dispersed in conventional display device. These polyimide islands are connected by ribbon-shaped connecting bridge (hinge) areas, wherein pixel circuits are distributed over polyimide islands, and metal traces between the pixel circuits are distributed over the ribbon connecting bridge areas.

When the display devices are stretched and deformed, the connecting bridge areas will be deformed under force, and strain resistance of the connecting bridge areas is inversely proportional to width of the connecting bridge areas. Currently, metal layers in pixel island areas are often configured with titanium, molybdenum, and titanium layered composite structures (Ti/Mo/Ti) to make gate electrodes, source electrodes, drain electrodes, gate connection lines, source connection lines, and drain connecting lines. Since the metal layers containing molybdenum are poor in bending resistance, the metal layers are not suitable for making metal traces in the connecting bridge areas. Furthermore, metal traces in the connecting bridge areas are usually formed in parallel in a same layer, and are spaced apart from each other at a certain distance in a horizontal direction to prevent short circuits. However, such a distance being reserved will cause the connecting bridge areas to be too wide, thereby adversely affecting bending performance of the connecting bridge areas.

In summary, there are technical problems existing in the prior art that the width of the connecting bridge areas of display devices is too large, which causes poor bending performance and thus is prone to fracture and failure, thereby adversely affecting normal display of the display devices.

SUMMARY OF INVENTION

The present invention is to provide a display panel and a display device capable of reducing a width of a connection bridge region, improving bending resistance of the connection bridge region, and reducing a risk of failure resulting from fracture during a stretching process.

In a first aspect, in order to overcome the above-mentioned problem, the present invention provides a display panel, comprising a plurality of pixel island regions spaced apart from each other; a plurality of connection bridge regions connecting adjacent ones of the pixel island regions to each other; wherein at least one of the connection bridge regions comprises a first metal layer, a second metal layer, and a third metal layer disposed in a stacked arrangement, and each of the first metal layer, the second metal layer, and the third metal layer is patterned to allow for formation of at least one metal trace.

In one embodiment of the present invention, the display panel further comprises a base layer, a thin-film transistor array layer, a first planarization layer, a second planarization layer, and a pixel definition layer sequentially stacked on one another, wherein the first metal layer is disposed between the first planarization layer and the thin-film transistor array layer, and the second metal layer is disposed between the first planarization layer and the second planarization layer.

In one embodiment of the present invention, an opening is provided in the thin-film transistor array layer in the connection bridge region, and at least a filling layer is filled in the opening, wherein the filling layer comprises a first filling layer and a second filling layer, the first metal layer is located between the first planarization layer and the second filling layer, and the third metal layer is located between the first filling layer and the second filling layer.

In one embodiment of the present invention, the first metal layer is patterned to allow for formation of a first source/drain electrode in each of the pixel island regions, the second metal layer is patterned to allow for formation of a second source/drain electrode in each of the pixel island regions, and the third metal layer is patterned to allow for formation of a first gate electrode in each of the pixel island regions.

In one embodiment of the present invention, the thin-film transistor array layer in the connection bridge region further comprises a fourth metal layer, and the fourth metal layer and the third metal layer are disposed on different layers, wherein the fourth metal layer is patterned to allow for formation of a second gate electrode in each of the pixel island regions and at least a metal trace in the connection bridge region.

In one embodiment of the present invention, the filling layer further comprises a third filling layer disposed between the first planarization layer and the second filling layer, the fourth metal layer is located between the second filling layer and the third filling layer, and the first metal layer is located between the third filling layer and the first planarization layer.

In one embodiment of the present invention, at least two of the first metal layer, the second metal layer, the third metal layer, or the fourth metal layer have orthographical projections at least partially overlap each other on the base layer in the connection bridge region.

In one embodiment of the present invention, the at least one metal trace comprises some or all of a first driving power line, a second driving power line, a reset signal line, a first scan line, a second scan line, a light-emitting control signal line, and a data line, wherein the second metal layer is patterned to allow for formation of the first driving power line and the second driving power line in the connection bridge region, and the reset signal line, the first scan line, the second scan line, the light-emitting control signal line, and the data line are disposed in at least two of the first metal layer, the third metal layer, or the fourth metal layer.

In one embodiment of the present invention, one of the first driving power line and the second driving power line has a width greater than or equal to a width of each of the reset signal line, the first scan line, the second scan line, the light-emitting control signal line, and the data line.

In one embodiment of the present invention, each of the first metal layer, the second metal layer, and the third metal layer has a layered composite structure of titanium, aluminum, and titanium.

In a second aspect, the present invention provides a display device, comprising a display panel, and the display panel comprising a plurality of pixel island regions spaced apart from each other; a plurality of connection bridge regions connecting adjacent ones of the pixel island regions to each other; wherein at least one of the connection bridge regions comprises a first metal layer, a second metal layer, and a third metal layer disposed in a stacked arrangement, and each of the first metal layer, the second metal layer, and the third metal layer is patterned to allow for formation of at least one metal trace.

In one embodiment of the present invention, the display panel further comprises a base layer, a thin-film transistor array layer, a first planarization layer, a second planarization layer, and a pixel definition layer sequentially stacked on one another, wherein the first metal layer is disposed between the first planarization layer and the thin-film transistor array layer, and the second metal layer is disposed between the first planarization layer and the second planarization layer.

In one embodiment of the present invention, an opening is provided in the thin-film transistor array layer in the connection bridge region, and at least a filling layer is filled in the opening, wherein the filling layer comprises a first filling layer and a second filling layer, the first metal layer is located between the first planarization layer and the second filling layer, and the third metal layer is located between the first filling layer and the second filling layer.

In one embodiment of the present invention, the first metal layer is patterned to allow for formation of a first source/drain electrode in each of the pixel island regions, the second metal layer is patterned to allow for formation of a second source/drain electrode in each of the pixel island regions, and the third metal layer is patterned to allow for formation of a first gate electrode in each of the pixel island regions.

In one embodiment of the present invention, the thin-film transistor array layer in the connection bridge region further comprises a fourth metal layer, and the fourth metal layer and the third metal layer are disposed on different layers, wherein the fourth metal layer is patterned to allow for formation of a second gate electrode in each of the pixel island regions and at least a metal trace in the connection bridge region.

In one embodiment of the present invention, the filling layer further comprises a third filling layer disposed between the first planarization layer and the second filling layer, the fourth metal layer is located between the second filling layer and the third filling layer, and the first metal layer is located between the third filling layer and the first planarization layer.

In one embodiment of the present invention, at least two of the first metal layer, the second metal layer, the third metal layer, or the fourth metal layer have orthographical projections at least partially overlap each other on the base layer in the connection bridge region.

In one embodiment of the present invention, the at least one metal trace comprises some or all of a first driving power line, a second driving power line, a reset signal line, a first scan line, a second scan line, a light-emitting control signal line, and a data line, wherein the second metal layer is patterned to allow for formation of the first driving power line and the second driving power line in the connection bridge region, and the reset signal line, the first scan line, the second scan line, the light-emitting control signal line, and the data line are disposed in at least two of the first metal layer, the third metal layer, or the fourth metal layer.

In one embodiment of the present invention, one of the first driving power line and the second driving power line has a width greater than or equal to a width of each of the reset signal line, the first scan line, the second scan line, the light-emitting control signal line, and the data line.

In one embodiment of the present invention, each of the first metal layer, the second metal layer, and the third metal layer has a layered composite structure of titanium, aluminum, and titanium.

The present invention has advantageous effects as follows: compared with conventional display panels and display devices, the present invention aims to improve the connection bridge regions by forming at least one metal trace on each of the first metal layer, the second metal layer, and the third metal layer. As number of film layers forming metal traces increases, number of the metal traces distributed in a same film layer is reduced, which not only reduces an overall width of the connection bridge regions, but also improves bending resistance of the connection bridge regions, thereby reducing a risk of failure resulting from fracture during a stretching process, as well as improving product quality.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

Figure 1:
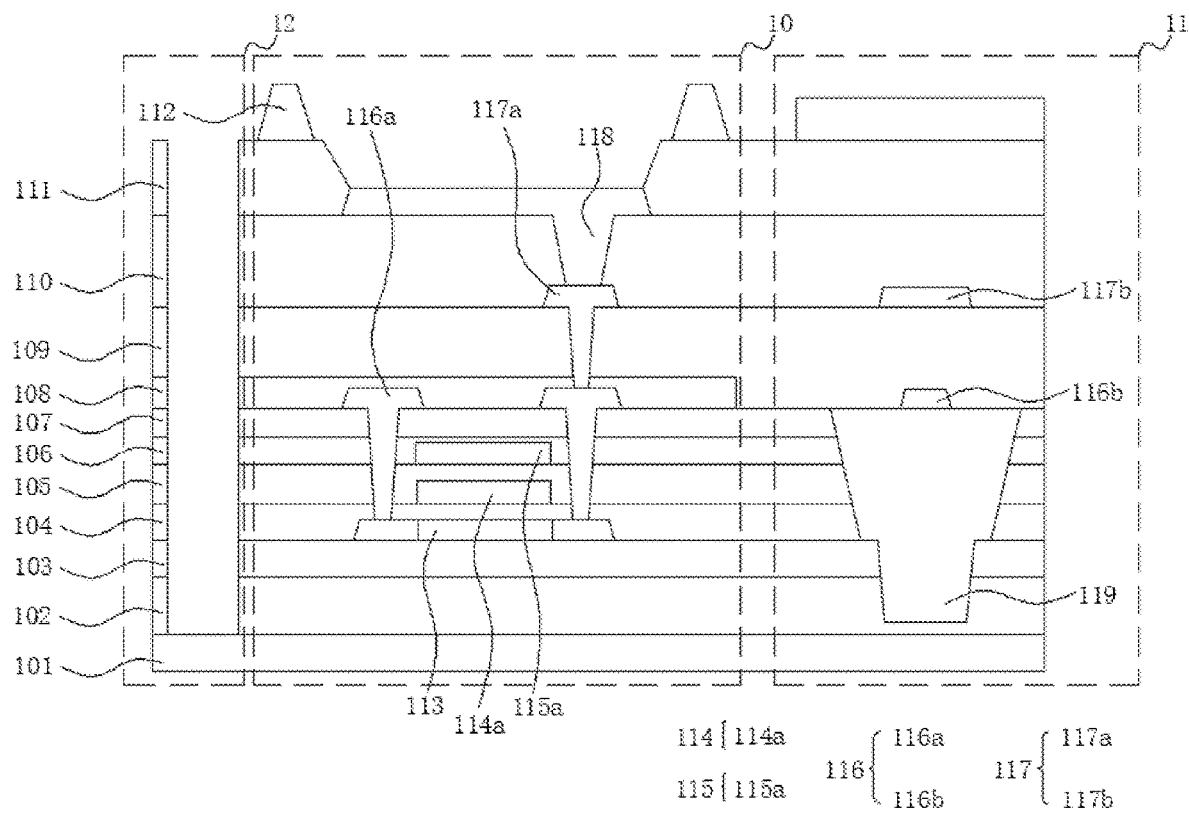
FIG. 1 is a schematic structural view of a display panel in prior art.

The technical solutions in the embodiments of the present invention will be clearly and completely described below in conjunction with the drawings in the embodiments of the present invention. Obviously, the described embodiments are only a part of the embodiments of the present invention, rather than all the embodiments. Based on the embodiments of the present invention, all other embodiments obtained by those skilled in the art without creative work shall fall within the protection scope of the present invention.

In the description of the present invention, it should be understood that the terms "center", "length", "width", "thickness", "upper", "lower", "left", "right", "vertical", indicating the orientation or positional relationship are based on the orientation or positional relationship shown in the drawings, and are only for the convenience of describing the present invention and simplifying the description, and do not indicate or imply that the device or element referred to must have a specific orientation, so it cannot be understood as a limitation of the present invention. Moreover, the terms "first" and "second" and the like are used for descriptive purposes only and are not to be construed as indicating or implying relative importance. Thus, features defining "first" or "second" may include one or more of the described features either explicitly or implicitly. In the description of the present invention, the meaning of "a plurality" is two or more unless specifically and specifically defined otherwise.

Figure 2:
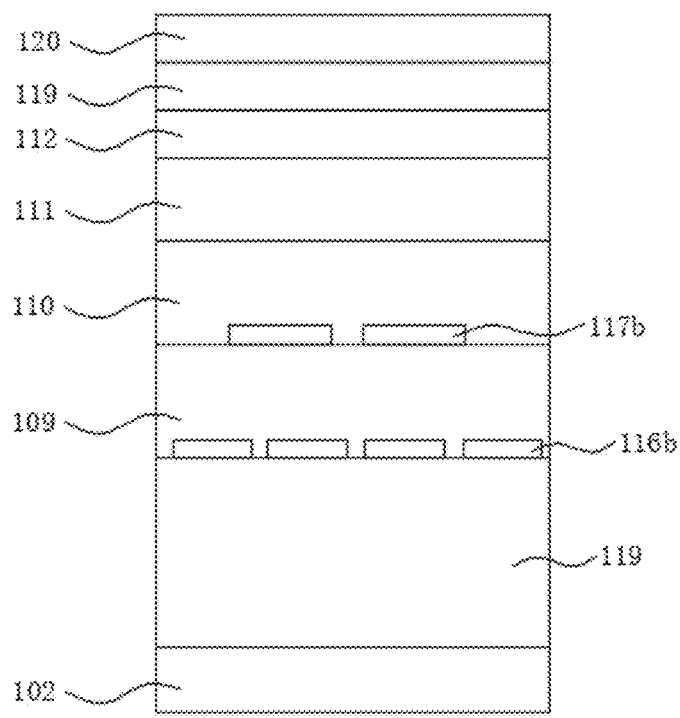
FIG. 2 is a schematic structural view of a connection bridge region in prior art.

In a conventional display panel, as shown in FIGS. 1 and 2, FIG. 1 is a schematic structural view of a display panel in prior art, and FIG. 2 is a schematic structural view of a connection bridge region in prior art. The display panel includes a pixel island region 10, a connection bridge region 11, and an exposed region 12. The display panel further includes a base layer 101, a polyimide layer 102, a buffer layer 103, a first gate insulating layer 104, a second gate insulating layer 105, a first interlayer dielectric layer 106, a second interlayer dielectric layer 107, an insulating layer 108, a first planarization layer 109, a second planarization layer 110, a pixel definition layer 111, a spacer 112, an active layer 113, a first metal layer 114, a second metal layer 115, a third metal layer 116, a fourth metal layer 117, an anode layer 118, and a first filling layer 119. The first metal layer 114 is patterned to form a first gate electrode 114a in the pixel island region 10, the second metal layer 115 is patterned to form a second gate electrode 115a in the pixel island region 10, the third metal layer 116 is patterned to form a first source/drain electrode 116a in the pixel island region 10 and a first metal wiring layer 116b in the connection bridge region 11, and the fourth metal layer 117 is patterned to form a second source/drain electrode 117a in the pixel island region 10 and a second metal wiring layer 117b in the connection bridge region 11. The first source/drain electrode 116a and the first metal wiring layer 116b are configured in a same layer, and the second source/drain electrode 117a and the second metal wiring layer 117b are configured in a same layer. One or more metal traces are configured in any one of the metal layers. When there are a plurality of the metal traces provided in a same metal wiring layer, the plurality of the metal traces are arranged in parallel and spaced from each other at a predetermined distance in a horizontal direction to prevent short circuits. Particularly, there are generally four the metal traces included in the first metal wiring layer 116b. Width of the four metal traces plus a space reserved between each of the four metal traces causes the connection bridge region 11 to be too wide, which affects bending performance of the connection bridge area 11.

Accordingly, embodiments of the present invention provide a display panel and a display device of which detailed descriptions are given below.

Figure 3:
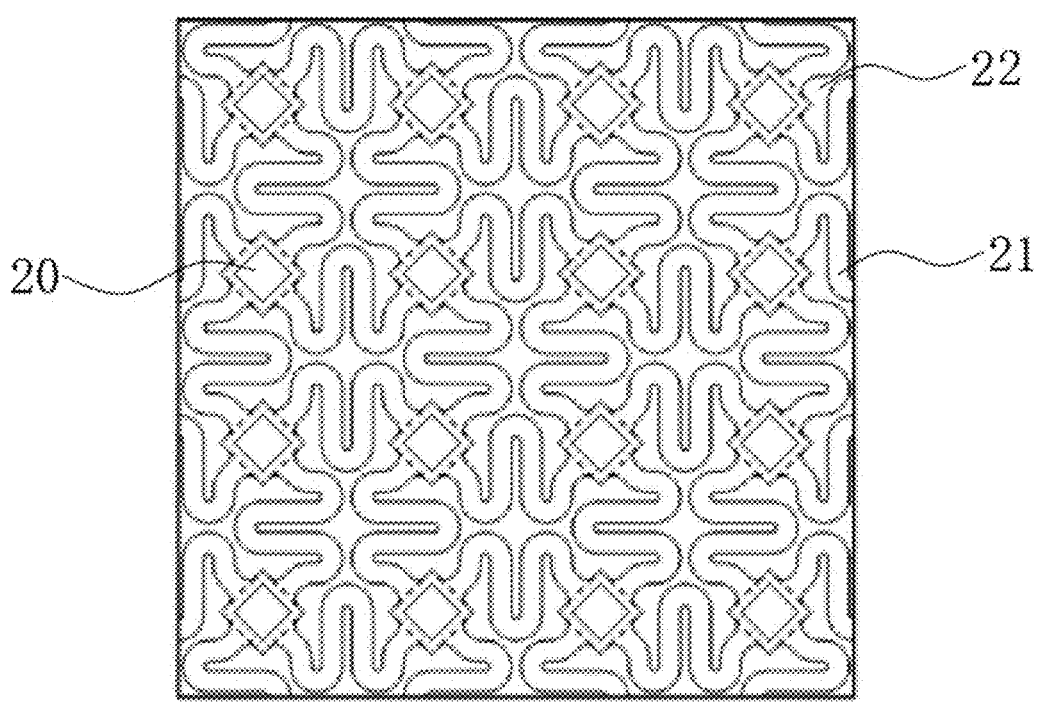
FIG. 3 is a top plan view of a display panel of an embodiment of the present invention.

First, an embodiment of the present invention provides a display panel. As shown in FIG. 3 showing a top plan view of a display panel of an embodiment of the present invention. The display panel includes a plurality of pixel island regions 20 spaced apart from each other, and a plurality of connection bridge regions 21 connecting adjacent ones of the pixel island regions 20 to each other. At least one of the connection bridge regions 21 includes a first metal layer 214, a second metal layer 215, and a third metal layer 216 disposed in a stacked arrangement, and each of the first metal layer 214, the second metal layer 215, and the third metal layer 216 is patterned to form at least one metal trace.

Compared with conventional display panels and display devices, the present invention aims to improve the connection bridge regions 21 by forming at least one metal trace on each of the first metal layer 214, the second metal layer 215, and the third metal layer 216. As number of film layers forming metal traces increases, number of the metal traces distributed in a same film layer is reduced, which reduces not only an overall width of the connection bridge regions 21, but also a risk of failure resulting from fracture during a stretching process, thereby improving bending resistance of the connection bridge regions 21, as well as improving product quality.

In one embodiment of the present invention, the display panel includes three types of regions: the pixel island regions 20, the connection bridge regions 21, and exposed regions 22. Each of the connection bridge regions 21 connects the pixel island regions 20 spaced apart from each other. Each of the pixel island regions 20 includes a thin-film transistor and a light-emitting element. Each of the connection regions 21 includes a bent portion capable of bending in at least two directions. An angle of the bent portion changes when the display panel is stretched. The angle of the bent portion becomes larger during a stretching process, and the angle of the bent portion decreases during a shrinking process. By changing the angle of the bent portion, the stress can be dispersed throughout the connection bridge regions 21. It is understood that the display panel not only has certain tensile properties, but also has certain shrinkage properties.

Figure 4:
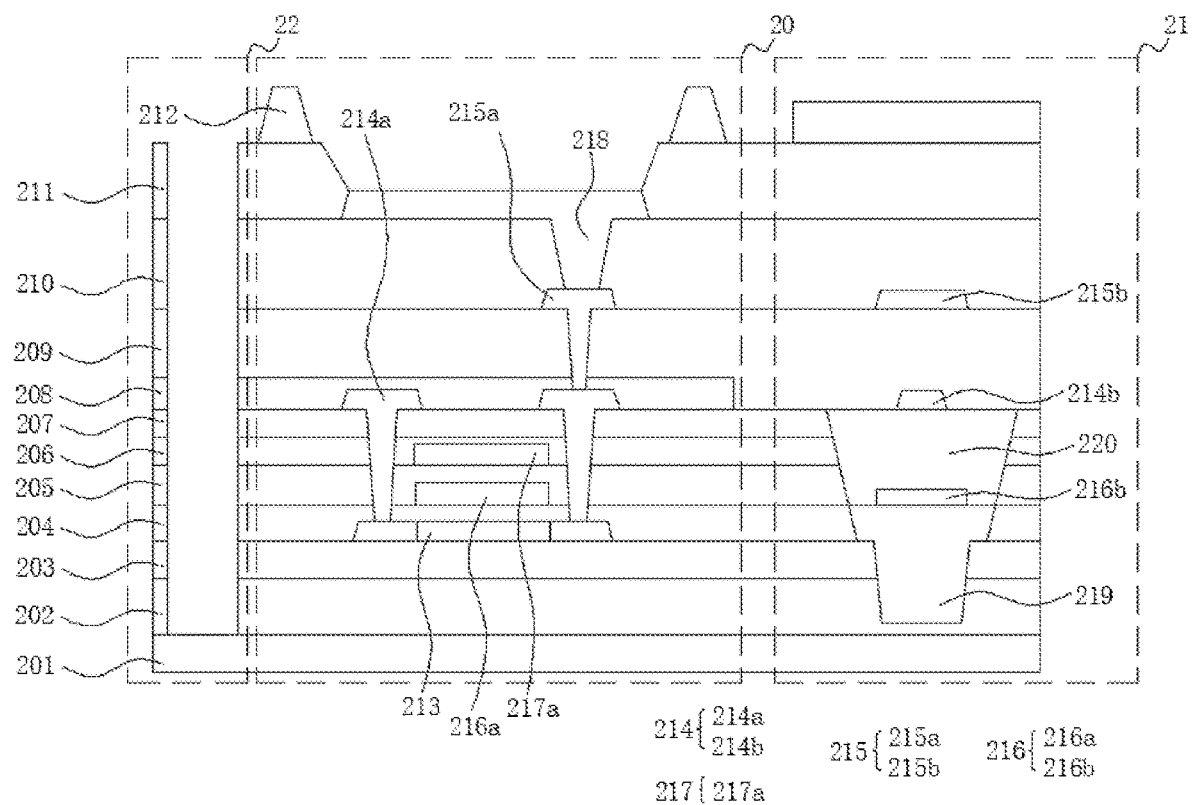
FIG. 4 is a schematic structural view of a display panel of an embodiment of the present invention.
Figure 5:
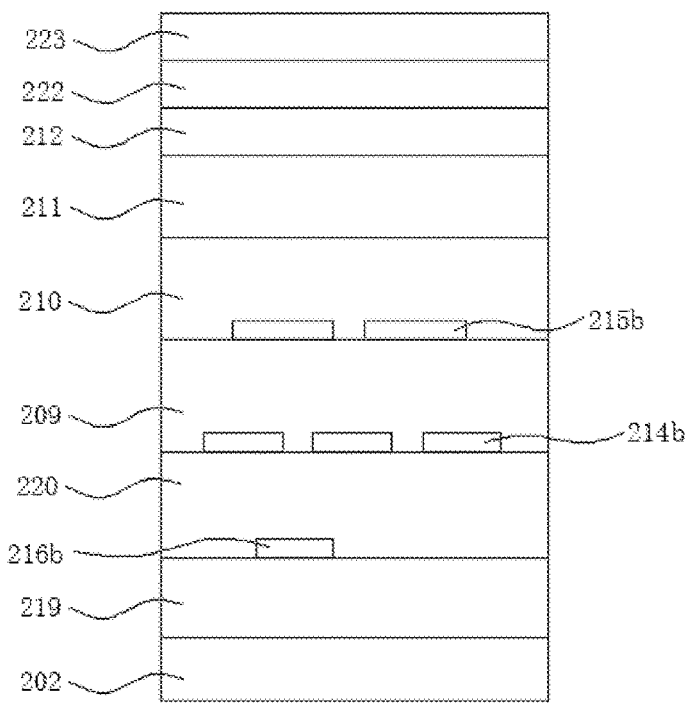
FIG. 5 is a schematic structural view showing a connection bridge region of a display panel of an embodiment of the present invention.

As shown in FIGS. 4 and 5, FIG. 4 is a schematic structural view of a display panel of an embodiment of the present invention, and FIG. 5 is a schematic structural view showing a connection bridge region of a display panel of an embodiment of the present invention. The three regions of the display panel are shown in a cross-sectional view as FIG. 4 of which a left part indicates the exposed region 22. A base layer 201 is disposed in the exposed region 22, and there are no other film layers provided over the base layer 201. On one hand, such a structure can save materials and reduce costs, and on the other hand, leave a deformation range for the connection bridge area 21 to enhance the bending resistance of the display panel. The pixel island region 20 is indicated in a middle part of FIG. 4, and the connection bridge region 21 is shown in a right part of FIG. 4. Each of the pixel island region 20 and the connection bridge region 21 includes a plurality of film layers disposed in a stacked arrangement. The display panel includes the base layer 201, a thin-film transistor array layer, a first planarization layer 209, a second planarization layer 210, and a pixel definition layer 211 sequentially stacked on one another. The first metal layer 214 is disposed between the first planarization layer 209 and the thin-film transistor array layer, and the second metal layer 215 is disposed between the first planarization layer 209 and the second planarization layer 210. The thin-film transistor array layer includes a first gate insulating layer 204, a second gate insulating layer 205, a first interlayer dielectric layer 206, a second interlayer dielectric layer 207, a passivation layer 208, and an active layer 213.

In one embodiment of the present invention, as shown in FIG. 4, an opening is provided in the thin-film transistor array layer in the connection bridge region 21, and at least a filling layer is filled in the opening. The filling layer includes a first filling layer 219 and a second filling layer 220. The first metal layer 214 is located between the first planarization layer 209 and the second filling layer 220, and the third metal layer 216 is located between the first filling layer 219 and the second filling layer 220.

In one embodiment of the present invention, the pixel island region 20 includes the base layer 201, a polyimide layer 202, a buffer layer 203, the first gate insulting layer 204, the second gate insulating layer 205, the first interlayer dielectric layer 206, the second interlayer dielectric layer 207, the passivation layer 208, the first planarization layer 209, the second planarization layer 210, the pixel definition layer 211, and a spacer 212 sequentially stacked from bottom to top. The pixel island region 20 further includes the active layer 213, the third metal layer 216, a fourth metal layer 217, the first metal layer 214, the second metal layer 215, and an anode layer 218 arranged from bottom to top. The connection bridge region 21 includes the first filling layer 219, the third metal layer 216, the second filling layer 220, the first metal layer 214, the first planarization layer 209, the second metal layer 215, the second planarization layer 210, the pixel definition layer 211, the spacer 212, a first chemical vapor deposition layer 222, and a second chemical vapor deposition layer 223 sequentially stacked from bottom to top. The first metal layer 214 is patterned to form a first source/drain electrode 214a in the pixel island region 20 and is patterned to form a first metal wiring layer 214b in the connection bridge region 21. The second metal layer 215 is patterned to form a second source/drain electrode 215a in the pixel island region 20 and is patterned to form a second metal wiring layer 215b in the connection bridge region 21. The third metal layer 216 is patterned to form a first gate electrode 216a in the pixel island region 20 and is patterned to form a third metal wiring layer 216b in the connection bridge region 21. The first chemical vapor deposition layer 222 is disposed on the spacer 212, and the second chemical vapor deposition layer 223 is disposed on the first chemical vapor deposition layer 222. It is noted that only some of film layers in the connection bridge region 21 are introduced here, and the other film layers are the same as the film layers in the pixel island region 20, and therefore are not reiterated. In the figures, the first metal wiring layer 214b, the second metal wiring layer 215b, the third metal wiring layer 216b, and a fourth metal wiring layer 217b described below can be referred to as a metal wiring layer, and the metal wiring layer refers to at least one metal trace formed by a corresponding metal layer.

In this embodiment, the connection bridge region 21 includes a plurality of metal traces. The thin-film transistor array layer in the connection bridge region 21 is to be exposed to form an opening. The opening has a cross-section formed by a plurality of inverted trapezoids. The opening is filled with the first filling layer 219 and the second filling layer 220, respectively, and the third metal layer 216 is also disposed in the opening. That is, the third metal layer 216 is disposed between the first filling layer 219 and the second filling layer 220, and the first metal layer 214 and the second metal layer 215 are disposed over the opening. That is, the first metal layer 214 is disposed between the second filling layer 220 and the first planarization layer 209. The second metal layer 215 is disposed between the first planarization layer 209 and the second planarization layer 210. The first filling layer 219, the second filling layer 220, the first planarization layer 209, and the second planarization layer 210 all include insulating materials to prevent occurrence of short circuits between different metal wiring layers. Since the connection bridge region 21 in this embodiment includes three metal wiring layers stacked on one another, the metal traces formed by the first metal layer 214, the second metal layer 215, and the third metal layer 216 are arranged in same layers as the first source/drain electrode 214a, the second source/drain electrode 215a, and the first gate electrode 216a, respectively. Compared with the prior art, number of metal wiring layers in this embodiment increases, so that number of the metal traces in a same one of the metal wiring layers is decreased, and an overall width of the connection bridge region 21 is reduced. It can be understood that, in this embodiment, taking the first metal wiring layer 214b, the second metal wiring layer 215b, and the third metal wiring layer 216b configured in same layers as the first source/drain electrode 214a, the second source/drain electrode 215a, and the first gate electrode 216a, respectively, as an example, in another embodiment of the present invention, in fact, the connection bridge region 21 still includes the first metal wiring layer 214b, the second metal wiring layer 215b, and the third metal wiring layer 216b. A difference from the previous embodiment lies in that the third metal wiring layer 216b is not formed by the third metal layer 216, but is formed by the fourth metal layer 217 which is patterned to form a second gate electrode 217a in the pixel island region 20 and the third metal wiring layer 216b in the connection bridge region 21. The metal traces formed by the first metal layer 214, the second metal layer 215, and the fourth metal layer 217 are configured in same layers as the first source/drain electrode 214a, the second source/drain electrode 215a, and the second gate electrode 217a, respectively.

Figure 6:
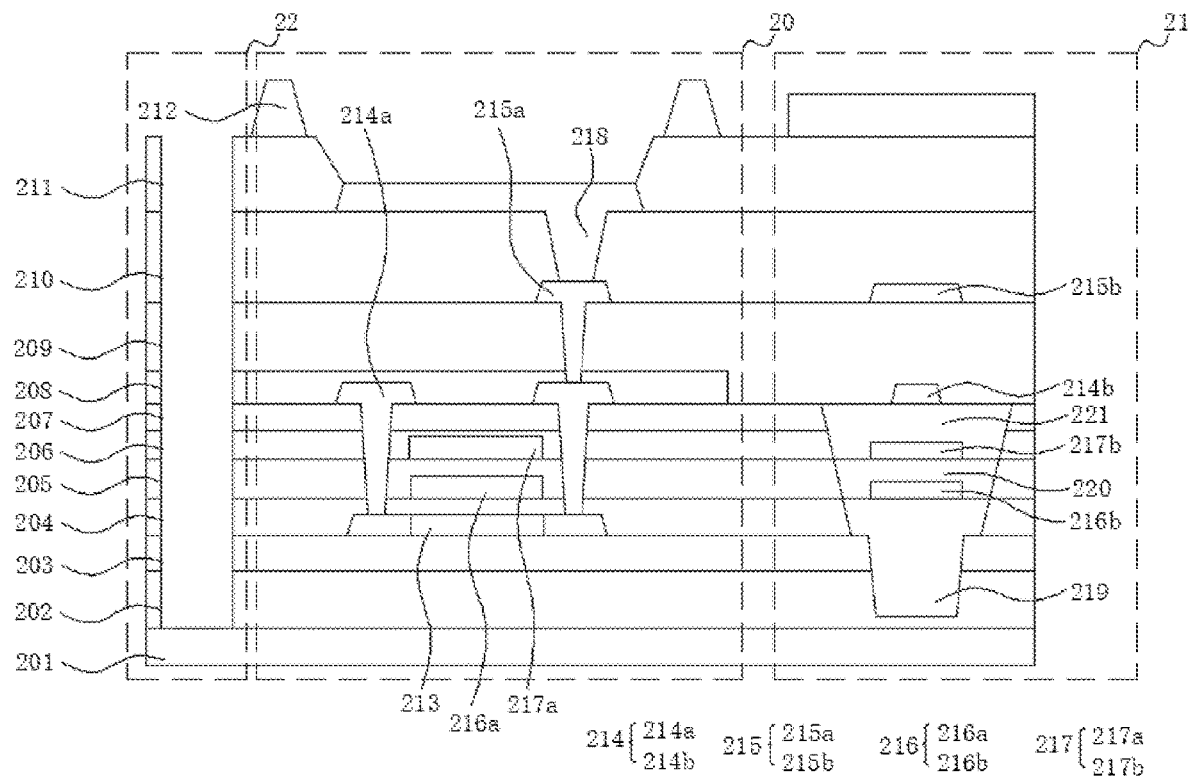
FIG. 6 is a schematic structural view of a display panel of another embodiment of the present invention.
Figure 7:
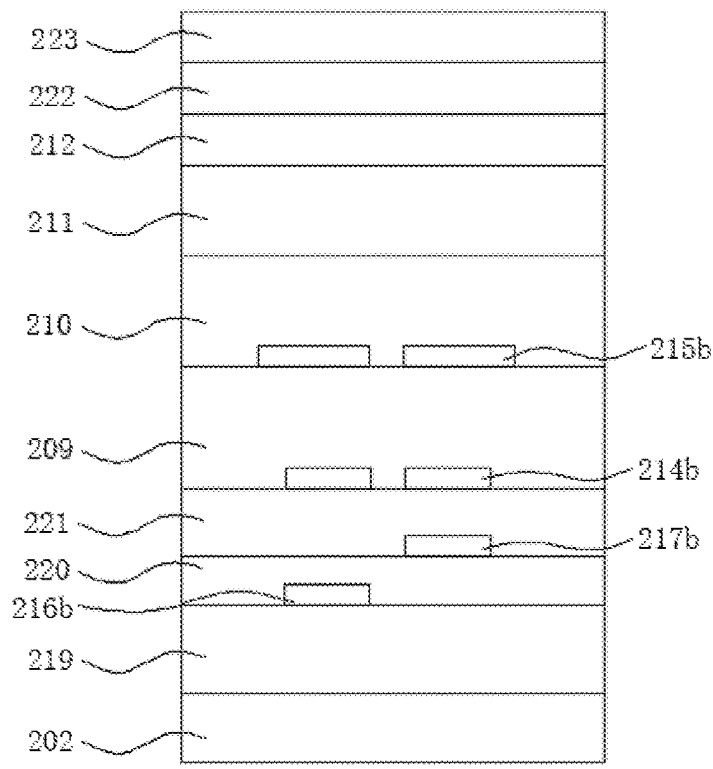
FIG. 7 is a schematic structural view showing a connection bridge region of a display panel of another embodiment of the present invention.

In another embodiment of the present invention, as shown in FIGS. 6 and 7, FIG. 6 is a schematic structural view of a display panel of another embodiment of the present invention, and FIG. 7 is a schematic structural view showing a connection bridge region of another embodiment of the present invention. The thin-film transistor array layer in the connection bridge region 21 further includes a fourth metal layer 217, and the fourth metal layer 217 and the third metal layer 216 are disposed on different layers. The fourth metal layer 217 is patterned to form a second gate electrode 217a in the pixel island region 21 and at least the metal trace 217b in the connection bridge region 21. The metal traces formed by the first metal layer 214, the second metal layer 215, the third metal layer 216, and the fourth metal layer 217 are configured in same layers as the first source/drain electrode 214a, the second source/drain electrode 215a, the first gate electrode 216a, and the second gate electrode 217a, respectively.

In this embodiment, the filling layer further includes a third filling layer 221 disposed between the first planarization layer 209 and the second filling layer 219. The fourth metal layer 217 is located between the second filling layer 220 and the third filling layer 221, and the first metal layer 214 is located between the third filling layer 221 and the first planarization layer 209. In addition, the second metal layer 215 is still situated between the first planarization layer 209 and the second planarization layer 210. The third metal layer 216 is still situated between the first filling layer 219 and the second filling layer 220.

In this embodiment, the display panel also includes three types of regions. The exposed region 22 and the pixel island region 20 are similar to each other in structure as described in the above-mentioned embodiments. But the connection bridge region 21 includes the first filling layer 219, the third metal layer 216, the second filling layer 220, the fourth metal layer 217, the third filling layer 221, the first metal layer 214, the first planarization layer 209, the second metal layer 216, the second planarization layer 210, the pixel definition layer 211, the spacer 212, the first chemical vapor deposition layer 222, and the second chemical vapor deposition layer 223 sequentially stacked from bottom to top. The first metal layer 214 is patterned to form the first source/drain electrode 214a in the pixel island region 20 and is patterned to form the first metal wiring layer 214b in the connection bridge region 21. The second metal layer 215 is patterned to form the second source/drain electrode 215a in the pixel island region 20 and is patterned to form the second metal wiring layer 215b in the connection bridge region 21. The third metal layer 216 is patterned to form the first gate electrode 216a in the pixel island region 20 and is patterned to form the third metal wiring layer 216b in the connection bridge region 21. The fourth metal layer 217 is patterned to form the second gate electrode 217a in the pixel island region 20 and is patterned to form the fourth metal wiring layer 217b in the connection bridge region 21. The first chemical vapor deposition layer 222 is disposed on the spacer 212, and the second chemical vapor deposition layer 223 is disposed on the first chemical vapor deposition layer 222.

In this embodiment, the connection bridge region 21 includes a plurality of metal traces. The thin-film transistor array layer in the connection bridge region 21 is to be exposed to form an opening. The opening has a cross-section formed by a plurality of inverted trapezoids. The opening is filled with the first filling layer 219, the second filling layer 220, and the third filling layer 221, respectively. The third metal layer 216 and the fourth metal are also disposed in the opening. The first metal layer 214 and the second metal layer 215 are disposed over the opening, and the third filling layer 221 is disposed between the fourth metal layer 217 and the first metal layer 214. Based on the foregoing embodiment, the third filling layer 221 also includes an insulating material to further prevent short circuits between different metal wiring layers.

Since the connection bridge region 21 includes four metal wiring layers disposed in a stacked arrangement, the metal traces formed by the first metal layer 214, the second metal layer 215, the third metal layer 216, and the fourth metal layer 217 are configured in the same layers as the first source/drain electrode 214a, the second source/drain electrode 215a, the first gate electrode 216a, and the second gate electrode 217a, respectively. Compared with the above-mentioned embodiments, the four metal wiring layers are provided in this embodiment having more layers than the three metal wiring layers as described in the above-mentioned embodiments. Accordingly, number of the metal traces in a same one of the metal wiring layers is further reduced, so that an overall width of the connection bridge region 21 can be further reduced. Although the technical effect is better, due to the increase in the number of film layers, a preparation process becomes relatively cumbersome. In actual production, a corresponding number of film layers and an overall width of the connection bridge region 21 are varied according to actual needs.

At least two of the first metal layer 214, the second metal layer 215, the third metal layer 216, or the fourth metal layer 217 have orthographical projections at least partially overlap each other on the base layer 201 in the connection bridge region 21. Orthographical projections of at least two of the metal wiring layers partially overlap each other, so that the width of the connection bridge region can be smaller. In an extreme case, the orthographic projections of the four metal wiring layers all overlap to make the width of the connection bridge region 21 the smallest under the same other conditions.

The connection bridge region 21 includes at least one metal trace, including some or all of a first driving power line VSS, a second driving power line VDD, a reset signal line VI, a first scan line Sn, a second scan line Sn_1, a light-emitting control signal line EM, and data lines (R, G, B). The second metal layer 215 is patterned into the first driving power line VSS and the second driving power line VDD in the connection bridge region 21. The reset signal line VI, the first scan line Sn, the second scan line Sn_1, the light-emitting control signal line EM, and the data lines (R, G, B) are disposed on at least two of the first metal layer 214, the third metal layer 216, or the fourth metal layer 217. One of the first driving power line VSS and the second driving power line VDD has a width greater than or equal to a width of each of the reset signal line VI, the first scan line Sn, the second scan line Sn_1, the light-emitting control signal line EM, and the data lines (R, G, B).

Since the width of each of the first driving power line VSS and the second driving power line VDD is greater than or equal to a width of each of other metal traces, in the prior art, due to manufacturing process limitations, the widths of the first driving power line VSS and the second driving power line VDD are generally larger than that of the other metal traces, the first driving power line VSS and the second driving power line VDD are intentionally configured in the second metal layer 215, while the other metal traces are all configured in the first metal layer 214. Since the number of metal traces formed by the first metal layer 214 in the prior art is relatively large, the metal traces usually having three or more metal traces, an overall width of the first metal wiring layer 214b is, in fact, greater than an overall width of the second metal wiring layer 215b. The width and spacing of the metal traces in the first metal wiring layer 214b are as small as possible without affecting their performance and causing short circuits. There is more space remained for arrangement of width and spacing of the metal traces in the second metal wiring layer 215b, so they can be enlarged or reduced within an appropriate range. In one embodiment of the present invention, the second metal layer 215 with a smaller number of metal traces is left unchanged, and the metal traces formed by the first metal layer 214 are shunted. The reset signal line VI, the first scan line Sn, the second scan line Sn_1, the light-emitting control signal line EM and the data lines (R, G, B) are formed in at least two of the first metal layer 214, the third metal layer 216, and the fourth metal layer 217. That is, as in the above-mentioned embodiments, move one or two of the metal traces in the first metal layer 214 to other film layers, so that an overall width of the first metal wiring layer 214b is reduced accordingly. In this manner, an overall width of the connection bridge region 21 can be reduced without affecting its own performance and without causing short circuits.

Since the third metal layer 216 and the fourth metal layer 217 are in a deep portion of the opening in the connection bridge region 21, the wiring space is not enough as the second metal layer 215 and the first metal layer 214. A number of metal traces formed by any one of the second metal layer 215 or the first metal layer 214 is greater than or equal to a number of metal traces formed by any one of the third metal layer 216 or the fourth metal layer 217. Widths of the reset signal line VI, the first scan line Sn, the second scan line Sn_1, the light-emitting control signal line EM, and the data lines (R, G, B) can be variable, so that their specific positions in the first metal layer 214, the third metal layer 216, and the fourth metal layer 217 are determined according to actual needs.

Figure 8:
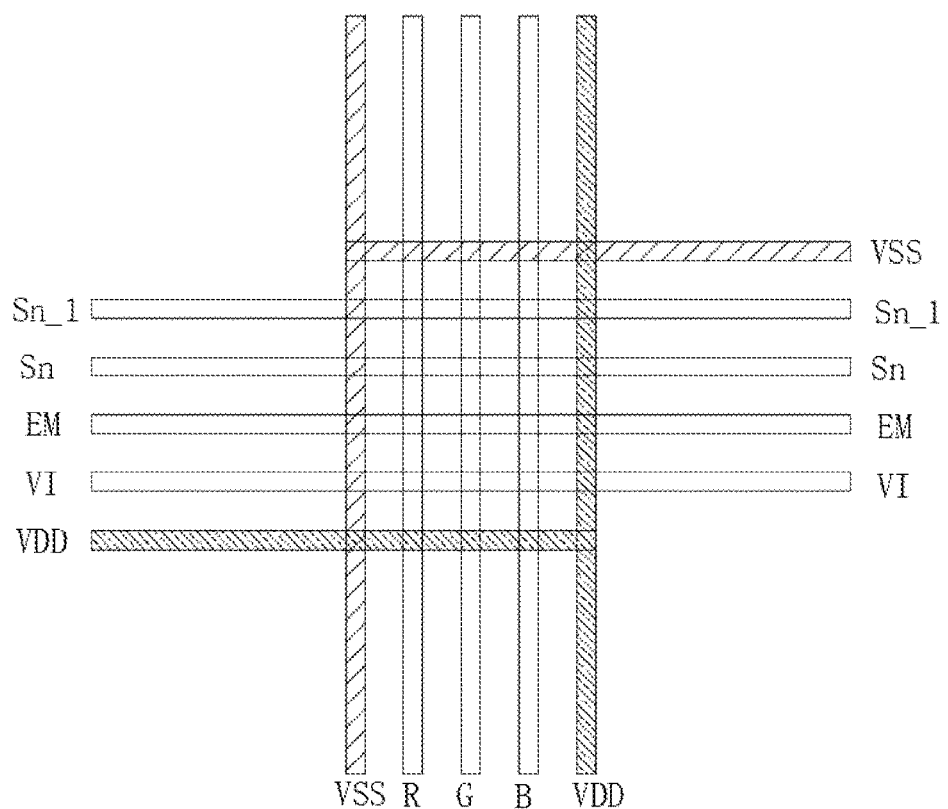
FIG. 8 is a schematic view showing a circuit in a pixel island region of a display panel of another embodiment of the present invention.

As shown in FIG. 8, which is a schematic view illustrating a circuit in a pixel island region in accordance with one embodiment of the present invention. The data lines (R, G, B) include a first data line, a second data line, and a third data line, which input R, G, and B signals, respectively. The pixel island region 20 includes a plurality of the metal traces interlaced in different directions. As shown in the figure, the first driving power line VSS, the second driving power line VDD, the reset signal line VI, the first scan line Sn, the second scan line Sn_1, and the light-emitting control signal line EM are arranged in a Rx direction. The first driving power line VSS, the second driving power line VDD, the first data line, the second data line, and the third data line are arranged in a Ry direction. The connection bridge regions 21 are arranged in different directions, respectively. Specifically, the connection bridge regions 21 arranged in a same direction but oriented in opposite sides are also different from each other for the metal traces included therein, such that the at least one metal trace in certain connection bridge regions 21 is composed of same metal lines (for example, metal lines oriented in upward and downward directions from a center in FIG. 8), while in the other connection bridge regions 21 the at least one metal trace includes different metal lines (for example, metal lines oriented in left and right directions from the center in FIG. 8). It should be noted that, in one embodiment, the connection bridge region 21 in the Rx direction also includes the first driving power line VSS and the second driving power line VDD. In another embodiment, the connection bridge region 21 in the Rx direction only one of the first driving power line VSS or the second driving power line VDD. Apparently, the connection bridge region 21 including only one of the metal lines has a width less than that of the connection bridge region 21 including both the first driving power line VSS and the second driving power line VDD, that is, a number of the metal traces in a same one of the connection bridge regions 21 is reduced, as well as reducing the width of the connection bridge region 21.

In the same connection bridge region 21, only some of the data lines in the pixel island region 20 are usually included, but the number and composition of the metal traces included in the different connection bridge regions 21 may be the same, or different. In one embodiment, a same one of the connection bridge regions 21 includes five metal traces, such as the first driving power line VSS, the second driving power line VDD, the reset signal line VI, the first scan line Sn, the second scan line Sn_1, and the light-emitting control signal line EM, or includes the first driving power line VSS, the second driving power line VDD, the first data line, the second data line, and the third data line. In another embodiment, a same one of the connection bridge regions 21 includes six metal traces, such as the first driving power line VSS, the second driving power line VDD, the reset signal line VI, the first scan line Sn, the second scan line Sn_1, and the light-emitting control signal line EM.

It can be understood that, first, the present invention takes three layers of the metal wiring layers and four layers of the metal wiring layers as examples. In fact, more metal wiring layers can be prepared to meet further requirements, if there is any, till the number of the metal wiring layers in the connection bridge region 21 is the same as the number of the metal traces. That is, there is only one metal trace configured in each of the metal wiring layers, so that a width of the connection bridge region 21 reaches a minimum. At this point, it should be noted that a proper spacing between adjacent two of the metal wiring layers in a vertical direction must be kept for preventing short circuits from occurring between the metal wiring layers due to an insufficient spacing.

In addition, in the above-mentioned embodiments, the second metal layer 215 includes two metal traces, and only number of metal traces in the first metal layer 214 changes. Furthermore, each of the third metal layer 216 and the fourth metal layer 217 includes only one metal trace or no metal trace. In fact, the number of metal traces included in each metal layer can be varied. The second metal layer 215 and the first metal layer 214 may include one or not include the metal trace, and the third metal layer 216 and the fourth metal layer 217 may include two or more metal traces. Both ends of the metal trace are connected to different pixel island regions 20, respectively, and a trace path does not affect its performance, and is determined according to actual needs.

Still further, a configuration of the first driving power line VDD and the second driving power line VSS in a same layer, without considering other metal traces in the above-mentioned embodiment is taken as an example. In fact, there is no corresponding relation between different metal trace layers and different metal traces. Any of the metal traces can pass through any of the metal layers, and is not limited in the present invention.

Finally, in the above-mentioned embodiment, a planarization layer or a filling layer is provided between adjacent two of the metal layers in the connection bridge region 20, and the planarization layer or the filling layer is made of an insulating material. The planarization layer includes the first planarization layer 209 or the second planarization layer 210, and the filling layer includes the first filling layer 219, the second filling layer 220, or the third filling layer 221. The planarization layer and the filling layer can maintain a proper distance between the different metal layers, and the use of insulating material for filling can further prevent short circuits between the different metal traces. In fact, the insulating material may not be filled, but compared to a configuration with the insulating material being filled, a distance between different metal layers needs to be larger, which is not beneficial to reducing a width and a thickness of the connection bridge region 20. In addition, the filling material is an insulating material with a certain degree of bending resistance, and there is no restriction on organic or inorganic materials.

Each of the first metal layer 214, the second metal layer 215, and the third metal layer 216 has a layered composite structure of titanium, aluminum, and titanium. Since bending resistance of aluminum is better than that of platinum, it is preferable that the first metal layer 214, the second metal layer 215, and the third metal layer 216 are provided to form bend-resistant metal traces in the connection bridge regions 20. A material of the metal trace includes aluminum. Due to active chemical properties of aluminum and low strength, titanium is prepared on upper and lower layers or around the aluminum for protection and support, so that a structure of the metal trace is a composite structure of titanium, aluminum, and titanium. That is, each of the first metal layer 214, the second metal layer 215, and the third metal layer 216 has a layered composite structure of titanium, aluminum, and titanium. In one embodiment, since the fourth metal layer 217 does not form metal traces in the connection bridge region 21, a material of the fourth metal layer 217 may include molybdenum or other metal materials. In another embodiment, metal traces are also formed by the fourth metal layer 217 in the connection bridge region 21, so that the fourth metal layer 217 is preferably a layered composite structure of titanium, aluminum, and titanium.

Each of the pixel island regions 20 includes a plurality of subpixels, and the plurality of subpixels are at least one red subpixel, at least one green subpixel, and at least one blue subpixel. Each of the subpixels is electrically connected to the data line, the first scan line Sn, and the second scan line Sn_1. In this embodiment, an area of the blue subpixel is greater than an area of the red subpixel or the green subpixel. The red subpixel, the green subpixel, and the blue subpixel are connected to the corresponding first data line, the second data line, and the third data line, respectively, and each of the subpixels is electrically connected to the first scan line Sn and the second scan line Sn_1.

In order to better implement the display panel in the embodiment of the present invention, based on the display panel, an embodiment of the present invention also provides a display device, and the display device includes the display panel as described in the aforementioned embodiment. By adopting the display panel described in the above embodiment, the performance of the display device can be further improved.

In the above-mentioned embodiments, the description of each embodiment has its own emphasis. For a part that is not described in detail in an embodiment, please refer to the detailed description of other embodiments above, which will not be repeated here. During specific implementation, each of the above units or structures can be implemented as independent entities, or can be combined arbitrarily, and implemented as the same or several entities. For the specific implementation of the above units, structures, or operations, please refer to the previous embodiments relating to the method, and it will not be repeated here.

The embodiments of the present invention are described in detail above, and specific examples are used in this article to illustrate the principles and implementation of the present invention. The descriptions of the above embodiments are only used to help understand the methods and core ideas of the present invention; those skilled in the art, based on the idea of the present invention, may have changes in the specific embodiments and the scope of application. Accordingly, the content of this specification should not be construed as limiting the present invention.

What is claimed is:

1. A display panel, comprising:
a plurality of pixel island regions spaced apart from each other;
a plurality of connection bridge regions connecting adjacent ones of the pixel island regions to each other;
wherein the display panel further comprises a base layer, a thin-film transistor array layer, a first planarization layer, a second planarization layer, and a pixel definition layer sequentially stacked on one another, wherein the first metal layer is disposed between the first planarization layer and the thin-film transistor array layer, and the second metal layer is disposed between the first planarization layer and the second planarization layer; and
wherein at least one of the connection bridge regions comprises a first metal layer, a second metal layer, and a third metal layer disposed in a stacked arrangement, and each of the first metal layer, the second metal layer, and the third metal layer is patterned to allow for formation of at least one metal trace.

2. The display panel of claim 1, wherein an opening is provided in the thin-film transistor array layer in the connection bridge region, and at least a filling layer is filled in the opening, wherein the filling layer comprises a first filling layer and a second filling layer, the first metal layer is located between the first planarization layer and the second filling layer, and the third metal layer is located between the first filling layer and the second filling layer.

3. The display panel of claim 2, wherein the first metal layer is patterned to allow for formation of a first source/drain electrode in each of the pixel island regions, the second metal layer is patterned to allow for formation of a second source/drain electrode in each of the pixel island regions, and the third metal layer is patterned to allow for formation of a first gate electrode in each of the pixel island regions.

4. The display panel of claim 3, wherein the thin-film transistor array layer in the connection bridge region further comprises a fourth metal layer, and the fourth metal layer and the third metal layer are disposed on different layers, wherein the fourth metal layer is patterned to allow for formation of a second gate electrode in each of the pixel island regions and at least a metal trace in the connection bridge region.

5. The display panel of claim 4, wherein the filling layer further comprises a third filling layer disposed between the first planarization layer and the second filling layer, the fourth metal layer is located between the second filling layer and the third filling layer, and the first metal layer is located between the third filling layer and the first planarization layer.

6. The display panel of claim 4, wherein at least two of the first metal layer, the second metal layer, the third metal layer, or the fourth metal layer have orthographical projections at least partially overlap each other on the base layer in the connection bridge region.

7. The display panel of claim 4, wherein the at least one metal trace comprises some or all of a first driving power line, a second driving power line, a reset signal line, a first scan line, a second scan line, a light-emitting control signal line, and a data line, wherein the second metal layer is patterned to allow for formation of the first driving power line and the second driving power line in the connection bridge region, and the reset signal line, the first scan line, the second scan line, the light-emitting control signal line, and the data line are disposed in at least two of the first metal layer, the third metal layer, or the fourth metal layer.

8. The display panel of claim 7, wherein one of the first driving power line and the second driving power line has a width greater than or equal to a width of each of the reset signal line, the first scan line, the second scan line, the light-emitting control signal line, and the data line.

9. The display panel of claim 1, wherein each of the first metal layer, the second metal layer, and the third metal layer has a layered composite structure of titanium, aluminum, and titanium.

10. A display device, comprising a display panel, and the display panel comprising:
a plurality of pixel island regions spaced apart from each other;
a plurality of connection bridge regions connecting adjacent ones of the pixel island regions to each other;
wherein the display panel further comprises a base layer, a thin-film transistor array layer, a first planarization layer, a second planarization layer, and a pixel definition layer sequentially stacked on one another, wherein the first metal layer is disposed between the first planarization layer and the thin-film transistor array layer, and the second metal layer is disposed between the first planarization layer and the second planarization layer, and wherein at least one of the connection bridge regions comprises a first metal layer, a second metal layer, and a third metal layer disposed in a stacked arrangement, and each of the first metal layer, the second metal layer, and the third metal layer is patterned to allow for formation of at least one metal trace.

11. The display device of claim 10, wherein an opening is provided in the thin-film transistor array layer in the connection bridge region, and at least a filling layer is filled in the opening, wherein the filling layer comprises a first filling layer and a second filling layer, the first metal layer is located between the first planarization layer and the second filling layer, and the third metal layer is located between the first filling layer and the second filling layer.

12. The display device of claim 11, wherein the first metal layer is patterned to allow for formation of a first source/drain electrode in each of the pixel island regions, the second metal layer is patterned to allow for formation of a second source/drain electrode in each of the pixel island regions, and the third metal layer is patterned to allow for formation of a first gate electrode in each of the pixel island regions.

13. The display device of claim 12, wherein the thin-film transistor array layer in the connection bridge region further comprises a fourth metal layer, and the fourth metal layer and the third metal layer are disposed on different layers, wherein the fourth metal layer is patterned to allow for formation of a second gate electrode in each of the pixel island regions and at least a metal trace in the connection bridge region.

14. The display device of claim 13, wherein the filling layer further comprises a third filling layer disposed between the first planarization layer and the second filling layer, the fourth metal layer is located between the second filling layer and the third filling layer, and the first metal layer is located between the third filling layer and the first planarization layer.

15. The display device of claim 13, wherein at least two of the first metal layer, the second metal layer, the third metal layer, or the fourth metal layer have orthographical projections at least partially overlap each other on the base layer in the connection bridge region.

16. The display device of claim 13, wherein the at least one metal trace comprises some or all of a first driving power line, a second driving power line, a reset signal line, a first scan line, a second scan line, a light-emitting control signal line, and a data line, wherein the second metal layer is patterned to allow for formation of the first driving power line and the second driving power line in the connection bridge region, and the reset signal line, the first scan line, the second scan line, the light-emitting control signal line, and the data line are disposed in at least two of the first metal layer, the third metal layer, or the fourth metal layer.

17. The display device of claim 16, wherein one of the first driving power line and the second driving power line has a width greater than or equal to a width of each of the reset signal line, the first scan line, the second scan line, light-emitting control signal line, and the data line.

18. The display device of claim 10, wherein each of the first metal layer, the second metal layer, and the third metal layer has a layered composite structure of titanium, aluminum, and titanium.

* * * * *